United States Patent [19]

Budnik

[11] Patent Number: 6,043,707

[45] Date of Patent: Mar. 28, 2000

[54] METHOD AND APPARATUS FOR OPERATING A RADIO-FREQUENCY POWER AMPLIFIER AS A VARIABLE-CLASS LINEAR AMPLIFIER

[75] Inventor: Brian Joseph Budnik, Watauga, Tex.

[73] Assignee: Motorola, Inc., Schaumburg, Ill.

[21] Appl. No.: 09/226,680

[22] Filed: Jan. 7, 1999

[51] Int. Cl.[7] ................................................. H03F 3/38
[52] U.S. Cl. .............................................. 330/10; 330/297
[58] Field of Search ........................... 330/10, 107, 149, 330/136, 297; 375/296, 297

[56] References Cited

U.S. PATENT DOCUMENTS

| | | |
|---|---|---|
| 3,900,823 | 8/1975 | Sokal et al. . |
| 4,631,491 | 12/1986 | Smithers . |
| 5,303,268 | 4/1994 | Tsutsumi et al. ......................... 375/60 |
| 5,420,536 | 5/1995 | Faulkner et al. . |
| 5,436,904 | 7/1995 | Pequet et al. ......................... 370/95.1 |
| 5,745,006 | 4/1998 | Budnik et al. . |
| 5,929,702 | 7/1999 | Myers et al. ............................. 330/136 |
| 5,936,464 | 8/1999 | Grondahl ................................. 330/10 |
| 5,973,556 | 10/1999 | Su ............................................ 330/10 |

OTHER PUBLICATIONS

Leonard R. Kahn, "Single–Sideband Transmission by Envelope Elimination and Restoration", pp. 803–806, 1952, USA.

*Primary Examiner*—Robert Pascal
*Assistant Examiner*—Henry Choe
*Attorney, Agent, or Firm*—R. Louis Breeden

[57] ABSTRACT

A variable-class linear amplifier (600, 800, 900) applies a supply type of envelope modulation to an RF power amplifier operating in or near compression at highest envelope amplitudes, and transitions gradually to an envelope tracking type of operation at intermediate envelope amplitudes. The amplifier further transitions gradually to a linear class of operation with a constant supply voltage (508) at lowest envelope amplitudes.

18 Claims, 8 Drawing Sheets

800

METHOD AND APPARATUS FOR OPERATING A RADIO-FREQUENCY POWER AMPLIFIER AS A VARIABLE-CLASS LINEAR AMPLIFIER

FIELD OF THE INVENTION

This invention relates in general to wireless communication systems, and more specifically to a method and apparatus for operating a radio-frequency (RF) power amplifier as a variable-class linear amplifier.

BACKGROUND OF THE INVENTION

It has long been known that non-linear classes of RF power amplifier operation which switch the RF devices on and off in or near saturation (such as in Class C, D, E, and F amplifiers) are more efficient than linear classes of operation such as Class A or Class AB in which the devices conduct during more than half of the RF cycle and are backed off significantly from compression. However, such non-linear modes of operation are convenient to use only for constant-envelope forms of modulation, such as frequency modulation (FM) and certain forms of phase modulation (PM). In order to apply non-constant envelope modulation methods {such as quadrature amplitude modulation (QAM) or single side band (SSB) or large-carrier AM or multiple-subchannel FM}, a linear transmitter is required.

Prior art solid state linear transmitters have used low-efficiency classes of operation such as Class A or AB in which the conduction angle exceeds 180 degrees, backed off from compression, in order to obtain sufficient linearity to avoid creating undesired spectral components consisting of sums and differences of various modulation frequencies (known as intermodulation distortion, or "IM").

Generally linearity may be broken down into two components: amplitude and phase linearity, as illustrated in FIGS. 1 and 2, respectively. These figures assume a linear class of operation (A or AB) and that the power output is controlled by varying the input signal level. An ideal linear amplifier would have a perfectly linear P-out/P-in characteristic, as shown in the dashed line 402, and phase shift which is unaffected by changes in power level. Since realizable power amplifiers (in any class of operation) suffer significantly from both forms of nonlinearity, as depicted by the solid lines 404, 410, both forms must be corrected. One type of correction uses feedback to perform linearity correction. Another type of correction, predistortion, performs an inverse amplitude and phase correction ahead of the amplifier such that the desired output is achieved. Fixed predistortion utilizes a fixed mapping based on typical measured characteristics, whereas adaptive digital predistortion periodically transmits a training signal which is fed back to a signal processor which adjusts the mapping over time.

A prior-art linear amplifier for amplifying a non-constant envelope signal (in this case large-carrier AM) is shown in FIG. 3; (predistortion or feedback linearity correction is not shown). Note that the envelope of the RF waveform 420 is not constant, and is precisely amplified by the power amplifier 424.

In order to use more efficient classes of RF power device operation while amplifying a non-constant envelope signal (requiring linear amplification), early AM broadcast transmitters utilized Class C plate-modulated final power amplifiers. Modulation was accomplished with large, expensive modulation transformers driven by audio power amplifiers. The modulators were limited in bandwidth (primarily by the transformer), and the audio amplifiers were inefficient, yet it was preferable to shift the dissipation from the final RF device to low-frequency audio power amplifiers in order to obtain higher efficiency in the RF output device(s), which resulted in higher RF output power for a given input power, and reduced power dissipation in the final RF device. Dissipation in the RF devices was (and still is) generally more costly than dissipation in low-frequency modulation devices, due to the higher cost of RF devices and their associated circuitry.

More recently, with the advent of high-efficiency switching regulators and power amplifiers, it has become possible to perform the task of envelope modulation in a way which is both efficient and capable of high bandwidth (with frequency response extending down to DC). FIG. 4 illustrates the use of such techniques to accomplish the required linear amplification using highly non-linear RF amplifiers 444, 446 in the transmitter. Note that the envelope amplitude is constant at the inputs of all the RF amplifier stages, and the supply modulation 452 (typically coupled to the collector or drain of the final stage 494) accomplishes the required amplitude variations (compare with FIG. 3).

For the case of large-carrier AM modulation as shown in FIG. 3 the required modulator bandwidth is approximately equal to the bandwidth of the modulating signals, since in this case there are no RF phase inversions. Unfortunately the modulator bandwidth must be very high for modulation waveforms in which RF phase inversions occur, such as that of 2-tone modulation, as illustrated in FIG. 5. Additionally, it is difficult to pass the phase inversions through the constant-envelope amplifiers, since any band-limiting will cause envelope fluctuations (such envelope fluctuations due to filtering are not shown in the top path of FIG. 5—instead, ideal 180 degree phase inversions are shown). Note the sharp reversals 460 in the switch-mode amplitude modulator output 474 near zero volts, which require much higher modulator bandwidth than the baseband modulating signals.

Another problem with the polar modulation scheme of FIG. 5 is the poor linearity achievable as the supply voltage approaches zero. Due to capacitive coupling within the final devices, the output power does not drop to zero when the supply voltage reaches zero. Also, for supply voltages near zero the phase shift in the final PA stage becomes excessive, due to the fact that the input-output capacitance forms a reactance which is typically larger than the load resistance, causing a bleed-through signal which is shifted 90 degrees from the normal output signal.

Thus, what is needed is an RF power amplifier which eliminates the bleed-through and phase shift effects of the polar modulation scheme as the supply voltage approaches zero, and which also eliminates the need for a modulator with much higher bandwidth than that of the baseband modulation signals, yet retains the high efficiency of the polar modulator.

SUMMARY OF THE INVENTION

An aspect of the present invention is a method of operating a radio-frequency (RF) power amplifier as a variable-class linear amplifier. The method comprises the steps of applying an envelope supply type of modulation at highest envelope amplitudes, to develop an output signal; and transitioning gradually to an envelope tracking type of operation at intermediate envelope amplitudes. The method also includes the step of further transitioning gradually to a linear class of operation with a constant supply voltage at lowest envelope amplitudes.

Another aspect of the present invention is a variable-class linear radio-frequency (RF) power amplifier, comprising a supply modulation element for applying an envelope supply type of modulation at highest envelope amplitudes, to develop an output signal; and an envelope tracking element coupled to the supply modulation element for transitioning gradually to an envelope tracking type of operation at intermediate envelope amplitudes. The amplifier also includes a linear operation element coupled to the supply modulation element for further transitioning gradually to a linear class of operation with a constant supply voltage at lowest envelope amplitudes.

Another aspect of the present invention is a method of operating a radio-frequency (RF) power amplifier as a variable-class linear amplifier. The method comprises the steps of coupling a composite RF signal to an input of the RF power amplifier, the signal having an envelope amplitude which varies with time; and forming a modulation waveform whose amplitude is substantially proportional to the envelope amplitude when the envelope amplitude is greater than a predetermined level, and whose amplitude transitions to a predetermined constant amplitude when the envelope amplitude is not greater than the predetermined level. The method further comprises the step of driving a supply input of the RF power amplifier with the modulation waveform, thereby operating the RF power amplifier in a mode selected from a group of modes, including an envelope supply modulation mode, an envelope tracking mode, and a linear mode, the mode determined by the envelope amplitude.

DETAILED DESCRIPTION OF THE DRAWINGS

Figure 5:
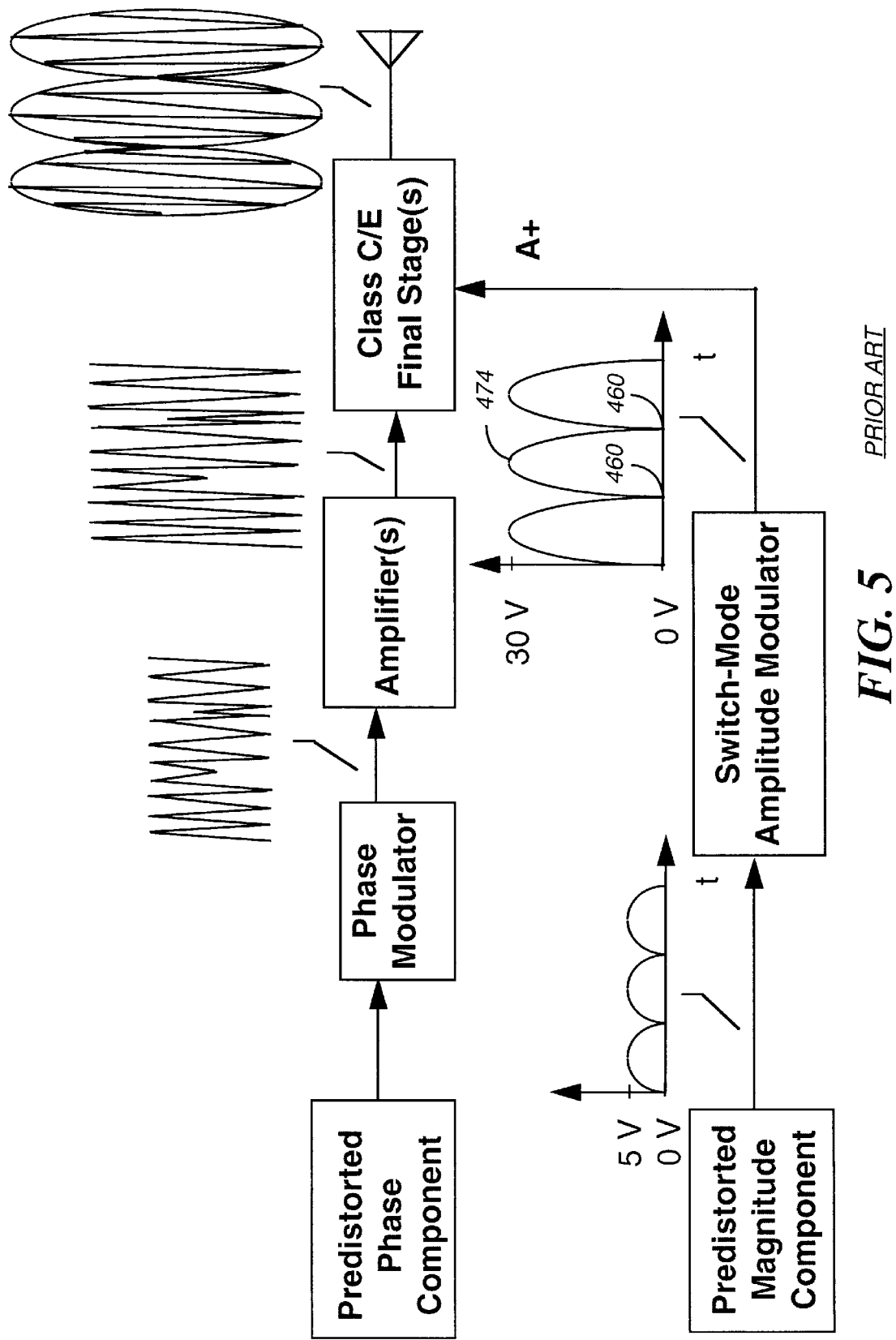
Figure 6:
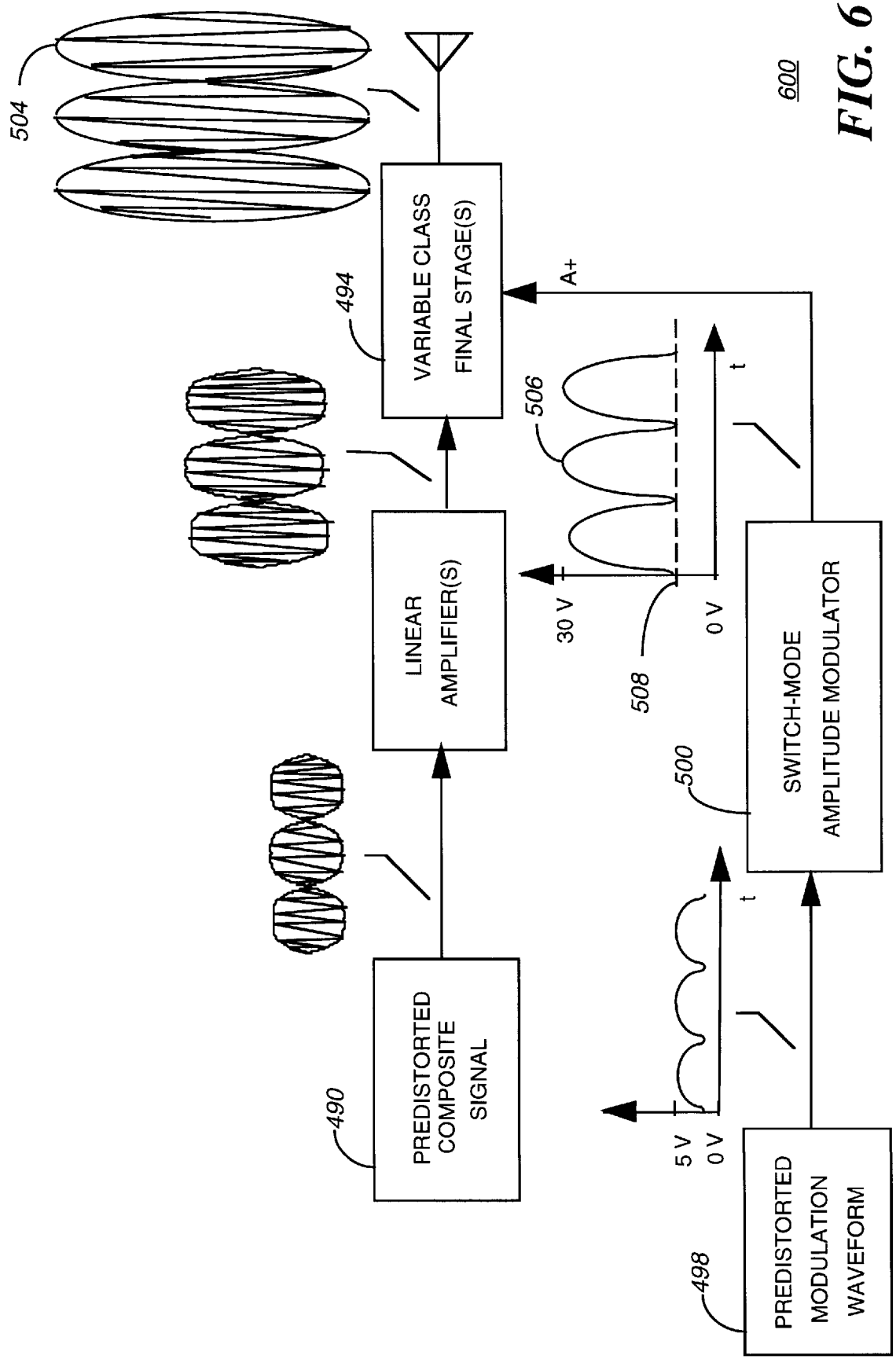
FIG. 6 is a simplified block diagram of an exemplary RF amplifier in accordance with the present invention.

FIG. 6 is a simplified electrical block diagram of an exemplary variable class RF amplifier 600 in accordance with the present invention, The amplifier 600 advantageously solves the problem of very high required amplitude modulator bandwidth to obtain optimal efficiency by transitioning gradually from purely linear amplification (as in FIG. 3) at low envelope amplitudes to envelope tracking at medium envelope amplitudes to envelope modulation (as in FIG. 5) at high envelope amplitudes. Though FIG. 6 shows only a predistortion linearity correction 490, 498, a combination of feedback and predistortion may also be employed, as shown later in detailed block diagrams. Note that the predistortion can take into account temperature variation either through direct measurement or by monitoring bias currents in the final RF power amplifier to optimally cancel amplifier nonlinearities.

Since all phase inversions occur as envelope power transitions through zero (low power), they will be handled by final-stage amplifier(s) 494 biased as linear Class A or AB with a low fixed supply voltage 508, which preferably supplies the operating voltage to the collector or drain of the final stage(s) 494. At low to medium envelope amplitudes the mode of operation transitions into "envelope tracking", in which the envelope is not actually formed by the amplitude modulator 500, but begins to track it, keeping the supply voltage 506 just high enough to keep the final stages 494 out of compression. At medium to high envelope amplitudes the amplitude modulator 500 actually forms the amplitude variations in the output signal 504, allowing the amplifier 494 to transition (through changes in bias and drive level) to highly efficient but non-linear classes of operation such as Class C, D, E, or F and to operate in compression. These classes of operation have a non-linear RF input/output characteristic since all allow the RF device (s) to saturate, and may also allow conduction during less than half the RF cycle. They may be used in a linear transmitter if the amplitude modulation component is applied through modulation of the supply voltage rather than through RF input signal amplitude variation. "Class C" is commonly used at UHF and higher RF frequencies, while at lower frequencies the other classes of operation (D, E, F) may offer superior efficiency. Thus, at medium to high envelope amplitudes the efficiency is that of a purely envelope (polar) modulated system as in FIG. 5 (in which the final RF amplifier stages are always in compression, and are utilizing an efficient non-linear class of operation), resulting in high power amplifier efficiency at these envelope amplitudes. At low envelope amplitudes the efficiency goes down due to the transition to Class A/AB operation, but at low envelope amplitudes the efficiency is not important since power dissipation becomes insignificant, as shown in Table 1 below. Thus the overall impact on power dissipation is minimal. The reduced efficiency at low envelope amplitudes is the tradeoff which enables the modulator bandwidth to be approximately as low as the bandwidth of the input baseband modulating signals. Linear operation at low envelope amplitudes also eliminates the phase distortion due to filtering which would be encountered at phase-reversals in the forward RF path of the polar modulation system of FIG. 5, and further eliminates the amplitude bleed-through and excessive phase shift near zero envelope amplitude points.

Figure 7:
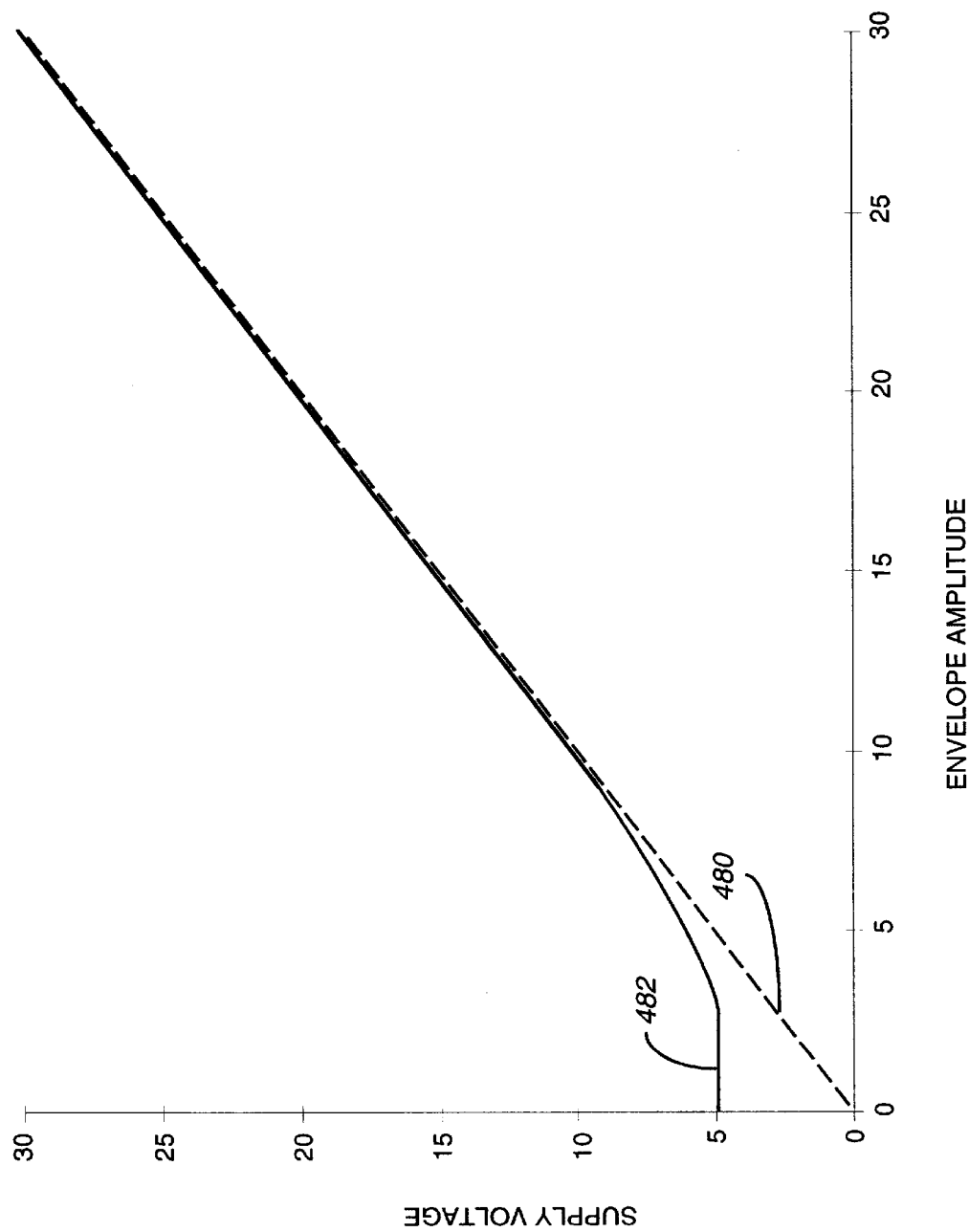
FIG. 7 is a graph depicting an example mapping between envelope amplitude and supply voltage of the RF amplifier in accordance with the present invention.

In the example mapping of FIG. 7, the solid line 482 represents the supply voltage to the power amplifier 494 (preferably coupled to the collector or drain of the final device), which is operated linearly with approximately constant supply voltage for envelope amplitudes below 5 volts peak. It is operated in an "envelope tracking" mode for envelope amplitudes between approximately 5 and 10 volts, and in an envelope (polar) modulation mode for envelope amplitudes over approximately 10 volts peak. (The dashed line 480 represents the supply voltage of an ideal polar amplifier.) Note that the transitions from linear to envelope tracking to envelope modulation are gradual and continuous.

Table 1 lists efficiency and dissipation for each type of amplifier as a function of output power, assuming maximum peak envelope power is 500 watts. Note that, in the variable class amplifier in accordance with the present invention, the efficiency even under class A or AB operation at low power is higher than that of a conventional amplifier operated in these classes of operation, since the supply voltage runs at a much lower (constant) voltage than a normal class A/AB amplifier having the same dynamic range.

Efficiencies in Table 1 are theoretical assuming ideal amplifier components, and are therefore higher than what would be achievable in typical RF power amplifiers. For simplicity, no backoff from compression is shown for Class A or B amplifiers, and the efficiency of the variable class amplifier when in envelope tracking mode is assumed to be that of a class B amplifier operated at full dynamic range. The variable class amplifier is assumed to convert to class B operation at and below 15W output (with supply voltage held fixed at a level which produces full dynamic range at 15 W output). Though not shown, Class AB efficiencies would be slightly below those of Class B.

TABLE 1

Efficiency and Dissipation in Final RF Device(s) for Various Classes of Operation versus Output Power

| Envelope Power Out | Class A Effic. | Class A Diss. | Class B Effic. | Class B Diss. | Class C (Polar) Effic. | Class C (Polar) Diss. | Variable Class Effic. | Variable Class Diss. |
|---|---|---|---|---|---|---|---|---|
| 500 W | 50% | 500 W | 78.5% | 137 W | 85% | 88 W | 85% | 88 W |
| 400 W | 40% | 600 W | 70.2% | 169 W | 85% | 71 W | 85% | 71 W |
| 300 W | 30% | 700 W | 60.8% | 193 W | 85% | 53 W | 85% | 53 W |
| 200 W | 20% | 800 W | 49.7% | 203 W | 85% | 35 W | 85% | 35 W |
| 100 W | 10% | 900 W | 35.1% | 185 W | 85% | 18 W | 85% | 18 W |
| 50 W | 5% | 950 W | 24.8% | 151 W | 85% | 8.8 W | 78.5% | 14 W |
| 25 W | 2.5% | 975 W | 17.6% | 117 W | 85% | 4.4 W | 78.5% | 6.8 W |
| 15 W | 1.5% | 985 W | 13.6% | 95 W | 85% | 2.6 W | 78.5% | 4.1 W |
| 10 W | 1% | 990 W | 11.1% | 80 W | 85% | 1.8 W | 64.1% | 5.6 W |
| 5 W | 0.5% | 995 W | 7.85% | 59 W | 85% | 0.9 W | 45.3% | 6.0 W |

Summarizing, a primary objective of the present invention is to optimize the efficiency of a linear RF power amplifier in a cost-effective manner. Preferably this is accomplished by the following techniques.

1) Allowing the power amplifier to operate in full compression and in non-linear classes of operation at high envelope amplitudes for best efficiency (as compared with envelope tracking), which reduces cost by reducing dissipation in the final amplifier and maximizing available output power from the RF devices.

2) Transitioning to an envelope tracking mode of operation at intermediate envelope amplitudes.

3) Operating the power amplifier in a low-efficiency linear class of operation only at low envelope amplitudes where the amount of dissipation is insignificant. This advantageously reduces the envelope modulator bandwidth requirement to approximately that of the baseband modulating signals, which minimizes cost.

Operating in the manner described above advantageously eliminates the problems caused by filtering in the RF phase path in polar modulation systems, yet achieves the efficiency of polar modulation at moderate to high envelope amplitudes. It also advantageously eliminates the problems of bleed-through and excessive phase shift as the envelope nears zero output power, which problems would exist in traditional polar modulation techniques (such as in "envelope elimination and restoration").

Performance of the variable class amplifier in accordance with the present invention can be further improved through the following additional techniques.

1) Taking into account RF power amplifier temperature variations in performing predistortion linearization. This can be accomplished either through direct temperature measurement or by monitoring bias current in the final RF power amplifier.

2) Providing variable relative amounts of linearization correction feedback to the amplitude modulation path and to the forward RF path, depending upon the class of operation, as described below.

Figure 8:
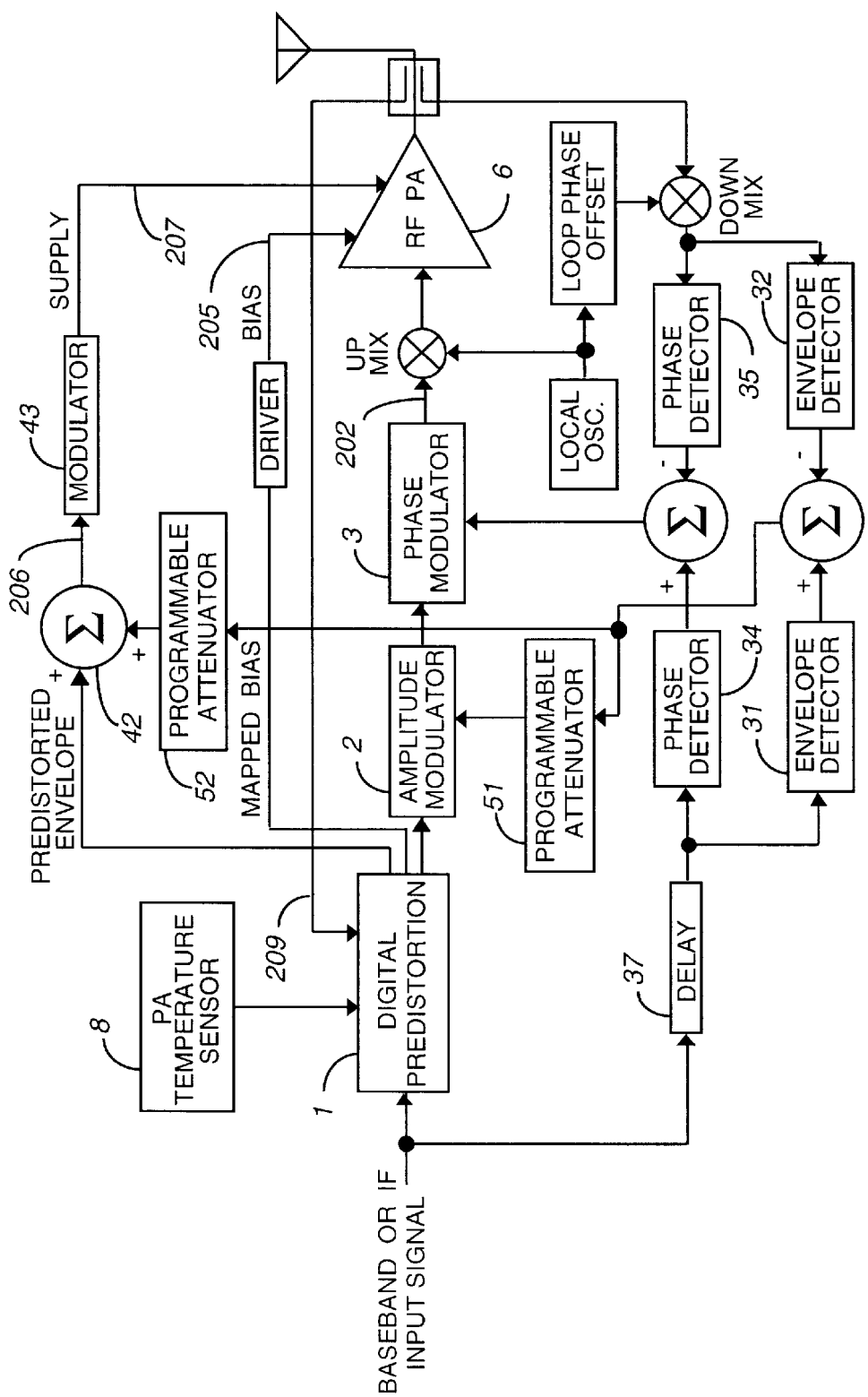
FIG. 8 is a detailed electrical block diagram of a first embodiment of the RF amplifier in accordance with the present invention.

FIG. 8 is a block diagram of a first exemplary embodiment 800 of the variable class amplifier in accordance with the present invention. In the embodiment 800 both digital predistortion and feedback are shown working together to perform linearity correction, in a manner similar to what is disclosed in U.S. Pat. No. 5,745,006 issued to Budnik et al. on Apr. 28, 1998, which patent is hereby incorporated herein by reference. Down-mixing may be required for use by a conventional adaptive predistortion block 1. A conventional delay element 37 matches the delay of digital predistortion block 1. The digital predistortion performed in the block 1 may be either adaptive or fixed; if fixed, the path 209 would be unnecessary. Mapping of supply level and bias amplitude are also performed by block 1 which changes the class of operation of the RF PA 6 at various signal levels. It will be appreciated that the delay element 37 in FIG. 8 can be replaced by two different delay elements whenever the phase detector 34 and the envelope detector 31 have substantially different delays. Preferably, the modulated supply path 207 supplies operating voltage to the collector or drain of amplification device(s) of RF PA 6.

Although not explicitly shown, the digital predistortion block 1 also compensates for any delay differences between the forward RF path 202 and the bias path 205 and modulated supply path 207. Using well-known techniques, the block 1, in cooperation with a conventional temperature sensor block 8, also considers temperature variations in the RF PA 6 which may affect the predistorted supply voltage modulation and bias mapping.

At low envelope amplitudes all feedback preferably is directed toward the forward RF path 202 to provide both amplitude and phase correction. At high envelope amplitudes the amplitude feedback is preferably directed toward the envelope (supply) modulation path 206. Because the RF PA 6 is insensitive to amplitude variations in its forward input RF path 202 at high envelope amplitudes (since it is operated in compression at high power levels), amplitude feedback applied to the forward RF path 202 would be largely ineffective in correcting amplitude linearity errors in the class of operation employed at high power levels. The optimal relative split of the corrective amplitude feedback signal between forward RF path 202 and envelope modulation path 206 is gradually adjusted according to class of operation as a function of power level as described below.

Figure 2:
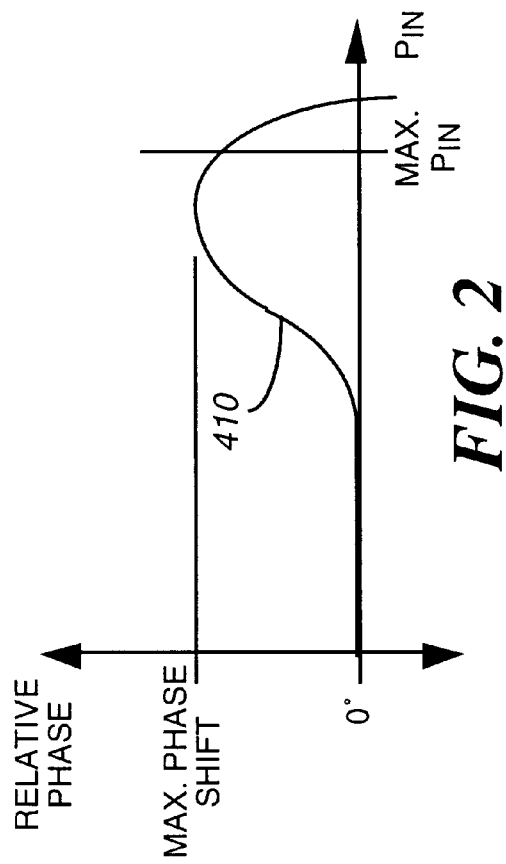
FIGS. 1 and 2 (previously discussed) are graphs illustrating amplitude and phase distortion in an RF amplifier.
Figure 1:
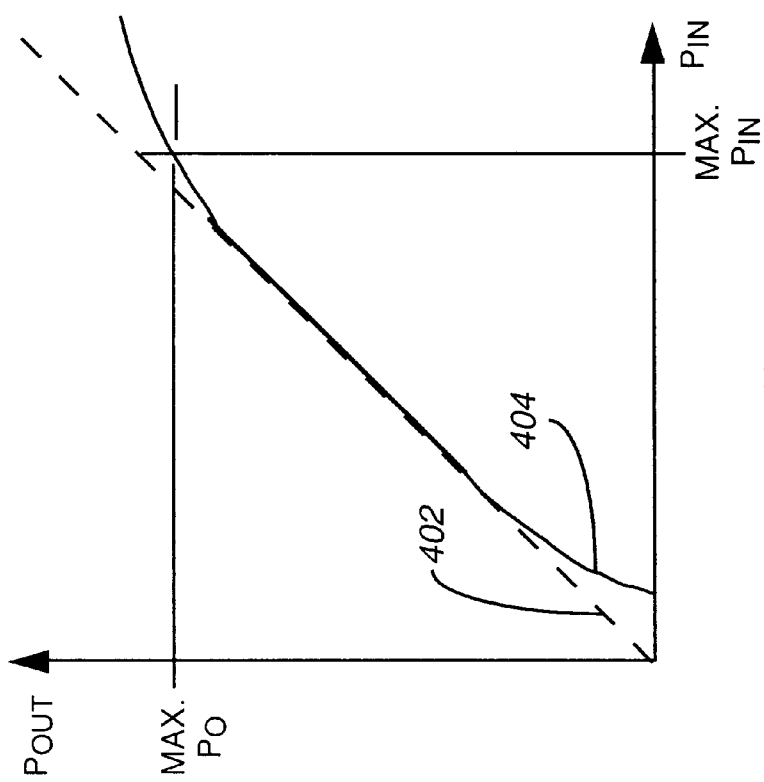
Figure 3:
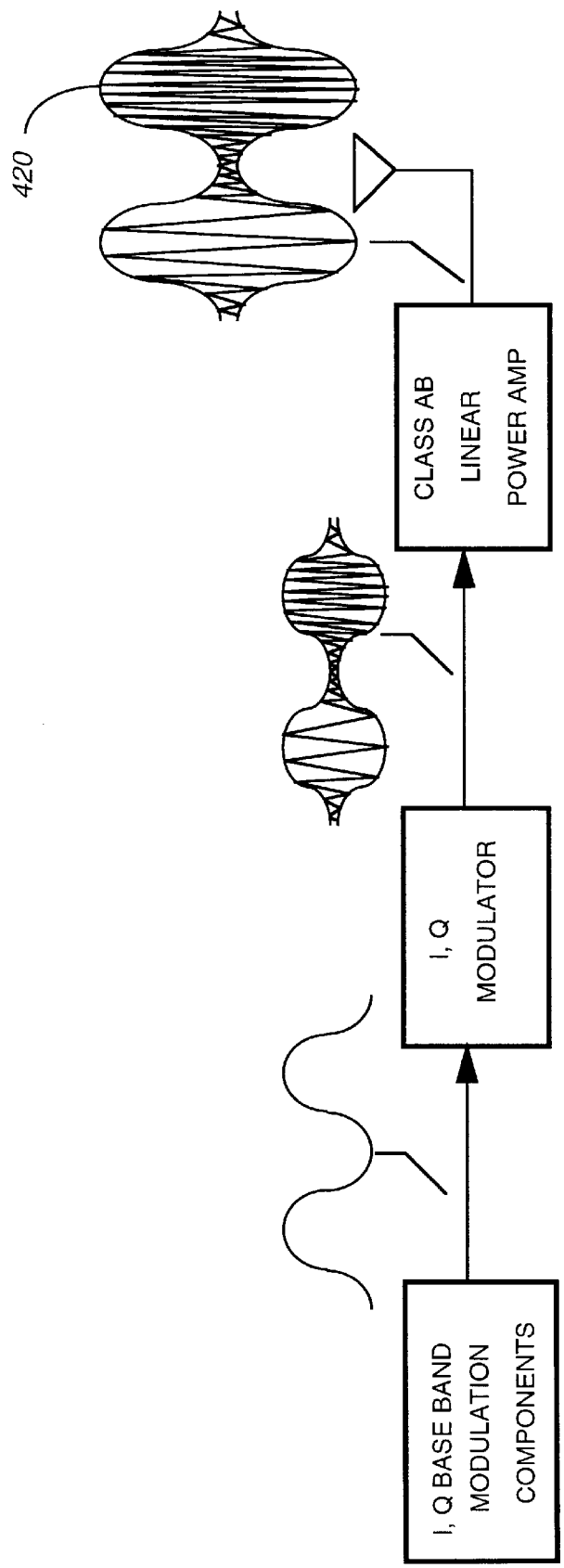
FIGS. 3–5 (previously discussed) are simplified block diagrams of prior-art RF amplifiers.
Figure 4:
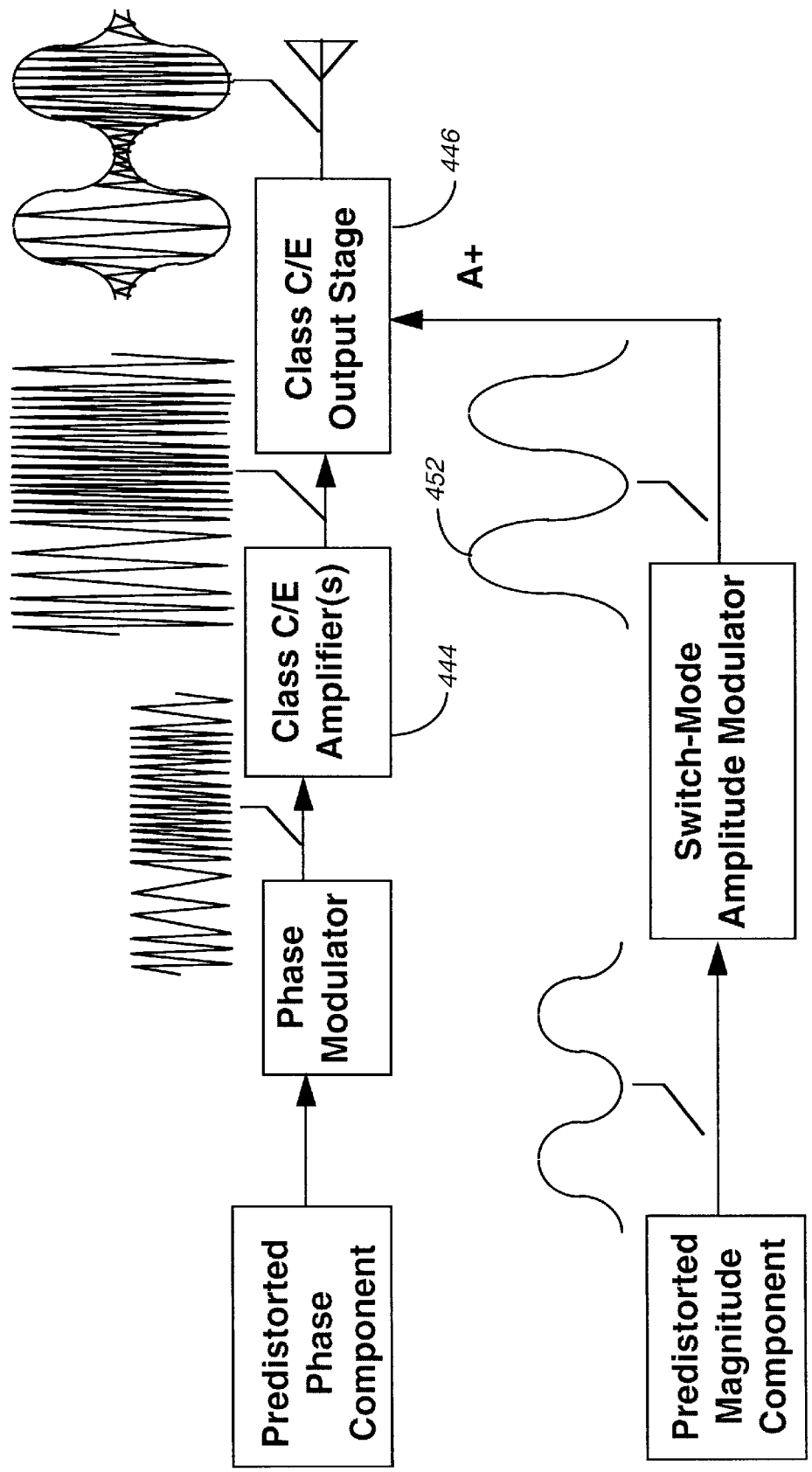

At low envelope amplitudes a programmable attenuator 52 is set to very high attenuation (no signal transmission) to a summer 42, while simultaneously the digital predistortion block 1 maps the supply voltage 207 to a low constant value and the bias to class A, AB, or B linear operation, dependent upon linearity/efficiency trade-offs desired. A programmable attenuator 51 is set to low attenuation at this time, such that essentially all of the amplitude linearity correction feedback is applied to the forward path 202 via an amplitude modulator 2, and none to an amplitude modulator 43. Thus, the amplifier is operating in a traditional linear mode with constant supply voltage as depicted in FIG. 3.

At intermediate envelope amplitudes the digital predistortion block 1 continues to map the bias to a linear mode of operation (such as class AB), but begins to map the supply voltage such that it tracks the RF envelope with a fixed offset sufficient to guarantee that the amplifier is not operated in compression. Additional overhead may be introduced (at the expense of reduced efficiency of the RF PA 6) in order to reduce the bandwidth of the amplitude modulator 43, such that it need not track the envelope precisely at the intermediate envelope amplitudes, where amplitude/time slopes are still high. Thus the amplitude modulator 43 may be reduced in bandwidth (to reduce cost) such that it only has sufficient bandwidth to precisely track the RF envelope at moderately high envelope amplitudes.

As power is increased to high levels, the bias path 205 is altered to bias the RF PA 6 into a nonlinear class of operation (such as Class C). Also, the digital predistortion block 1 begins to form the actual envelope through the supply modulation path 206, with the RF PA 6 driven into compression. The signal transmission level through the attenuator 52 is increased and the signal through the attenuator 51 is reduced, such that nearly all amplitude corrective feedback is applied to the envelope (supply) modulation path 206 and very little to the forward RF path 202, since the highly nonlinear classes of operation are largely unresponsive to amplitude variations in the path 202. Thus it is seen that amplitude feedback is effectively applied over the entire dynamic range of the RF PA 6, despite operation in or near compression at high power levels.

Figure 9:
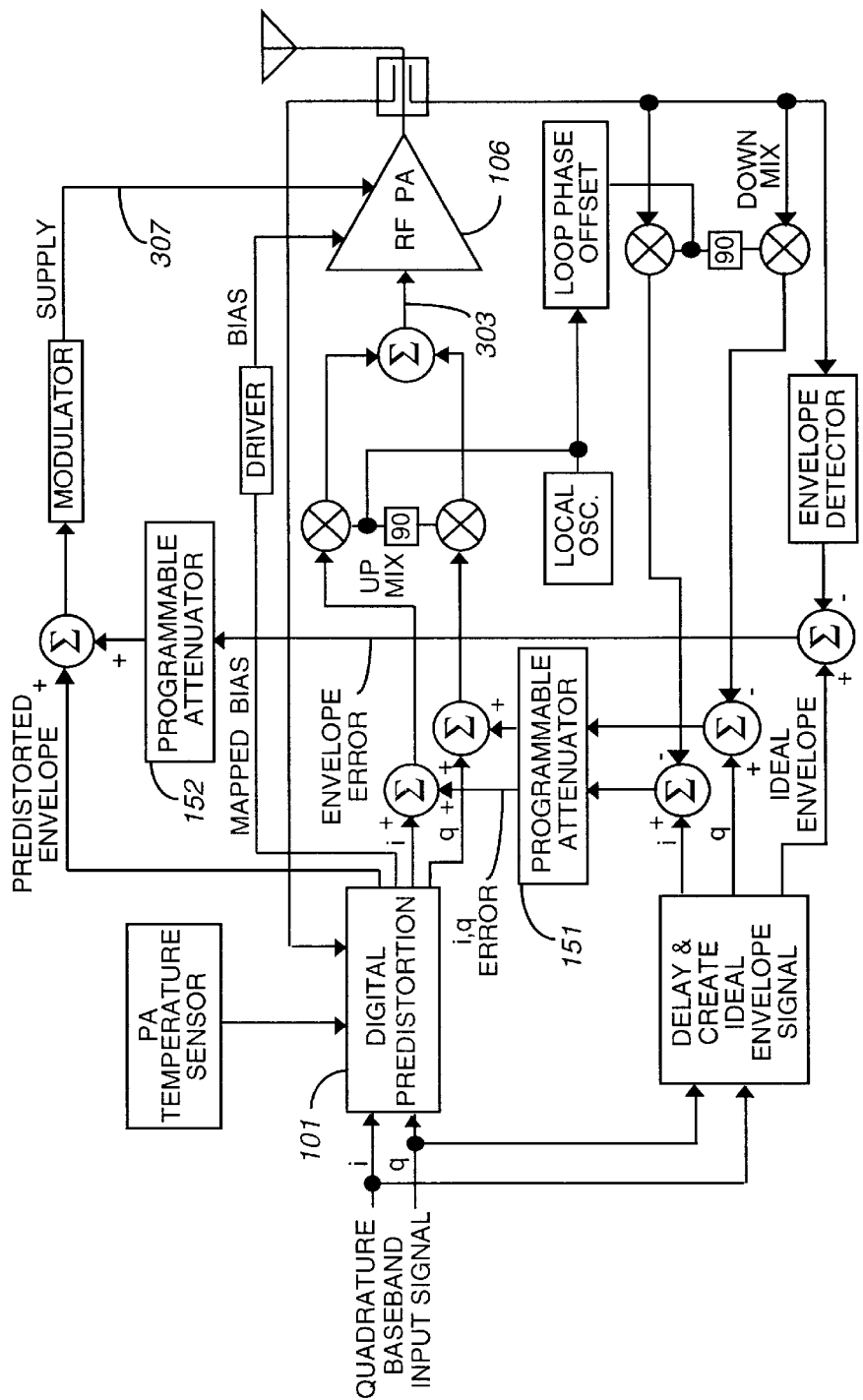
FIG. 9 is a detailed electrical block diagram of a second embodiment of the RF amplifier in accordance with the present invention.

FIG. 9 illustrates an electrical block diagram of a second exemplary embodiment 900 of the variable class amplifier in accordance with the present invention. The embodiment 900 is similar to the embodiment 800, the essential difference being that the embodiment 900 uses well-known Cartesian (i,q) baseband formation of the composite RF signal in the forward RF path 303. This requires the programmable attenuator 151 to be a dual attenuator (both the i and q paths receiving the same attenuation). In a manner similar to the embodiment 800, at low envelope amplitudes the supply to RF PA 106 is held constant, bias is mapped to class A or AB, attenuator 152 is set to very high attenuation and attenuator 151 is set to very low attenuation, channeling all of the feedback into the forward RF path 303. Quadrature feedback corrects for both amplitude and phase nonlinearities in the RF PA 106 which are not otherwise corrected by the predistortion block 101. At high envelope amplitudes the RF PA 106 is biased in an efficient nonlinear class of operation (such as Class C or higher) and operated in compression, attenuator 152 is set to medium attenuation, and attenuator 151 is set to medium attenuation, thus applying feedback approximately equally to both the forward RF path 303 and the modulated supply path 307. Since the forward RF path 303 is largely insensitive to amplitude variations in this class of operation, this effectively limits the feedback applied to this path through the attenuator 151 to performing predominantly phase correction, whereas the portion of the feedback applied through the attenuator 152 performs nearly all of the amplitude correction.

Thus, it should be clear from the preceding disclosure that the present invention provides a method and apparatus in an RF power amplifier which advantageously eliminates the bleed-through and phase shift effects of the polar modulation scheme as the output power approaches zero, and which also advantageously eliminates the need for a modulator with much higher bandwidth than that of the baseband modulation signals, yet retains the high efficiency of the polar modulator.

Many modifications and variations of the present invention are possible in light of the above teachings. Thus, it is to be understood that, within the scope of the appended claims, the invention can be practiced other than as specifically described herein above.

What is claimed is:

1. A method of operating a radio-frequency (RF) power amplifier as a variable-class linear amplifier, the method comprising the steps of:

applying an envelope supply type of modulation at highest envelope amplitudes, to develop an output signal;

transitioning gradually to an envelope tracking type of operation at intermediate envelope amplitudes; and further transitioning gradually to a linear class of operation with a constant supply voltage at lowest envelope amplitudes.

2. The method of claim 1, further comprising the step of continuously applying both feedback and predistortion linearity correction techniques.

3. The method of claim 1, further comprising the step of employing feedback to correct both amplitude and phase errors.

4. The method of claim 1, further comprising the step of predistorting at least one of an RF signal and a supply modulation signal in response to amplifier temperature information.

5. The method of claim 1, further comprising the step of providing feedback to both a forward RF path and a modulated supply path.

6. The method of claim 1, further comprising the step of providing variable relative amounts of linearization correction feedback to a modulated supply path and to a forward RF path, dependent upon a degree to which the RF power amplifier is driven into compression by the forward RF path.

7. A variable-class linear radio-frequency (RF) power amplifier, comprising:

supply modulation means for applying an envelope supply type of modulation at highest envelope amplitudes, to develop an output signal;

envelope tracking means coupled to the supply modulation means for transitioning gradually to an envelope tracking type of operation at intermediate envelope amplitudes; and linear operation means coupled to the supply modulation means for further transitioning gradually to a linear class of operation with a constant supply voltage at lowest envelope amplitudes.

8. The RF power amplifier of claim 7, further comprising linearity correction means coupled to the supply modulation means for continuously applying both feedback and predistortion linearity correction techniques.

9. The RF power amplifier of claim 7, further comprising feedback means coupled to the supply modulation means and coupled to a forward RF path for employing feedback to correct both amplitude and phase errors.

10. The RF power amplifier of claim 7, further comprising predistortion means coupled to power amplifier temperature sensor means for predistorting at least one of an RF signal and a supply modulation signal in response to amplifier temperature information.

11. The RF power amplifier of claim 7, further comprising dual feedback means for providing feedback to both a forward RF path and a modulated supply path.

12. The RF power amplifier of claim 7, further comprising attenuator means for providing variable relative amounts of linearization correction feedback to a modulated supply path and to a forward RF path, dependent upon a degree to which the RF power amplifier is driven into compression by the forward RF path.

13. A method of operating a radio-frequency (RF) power amplifier as a variable-class linear amplifier, the method comprising the steps of:

coupling a composite RF signal to an input of the RF power amplifier, the signal having an envelope amplitude which varies with time;

forming a modulation waveform whose amplitude is substantially proportional to said envelope amplitude when said envelope amplitude is greater than a predetermined level, and whose amplitude transitions to a predetermined constant amplitude when said envelope amplitude is not greater than the predetermined level; and driving a supply input of the RF power amplifier with the modulation waveform, thereby operating the RF power amplifier in a mode selected from a group of modes, including an envelope supply modulation mode, an envelope tracking mode, and a linear mode, the mode determined by the envelope amplitude.

14. The method of claim 13, further comprising the step of continuously applying both feedback and predistortion linearity correction techniques.

15. The method of claim 13, further comprising the step of employing feedback to correct both amplitude and phase errors.

16. The method of claim 13, further comprising the step of predistorting at least one of an RF signal and a supply modulation signal in response to amplifier temperature information.

17. The method of claim 13, further comprising the step of providing feedback to both a forward RF path and a modulated supply path.

18. The method of claim 13, further comprising the step of providing variable relative amounts of linearization correction feedback to a modulated supply path and to a forward RF path, dependent upon a degree to which the RF power amplifier is driven into compression by the forward RF path.

* * * * *